Figure 1:
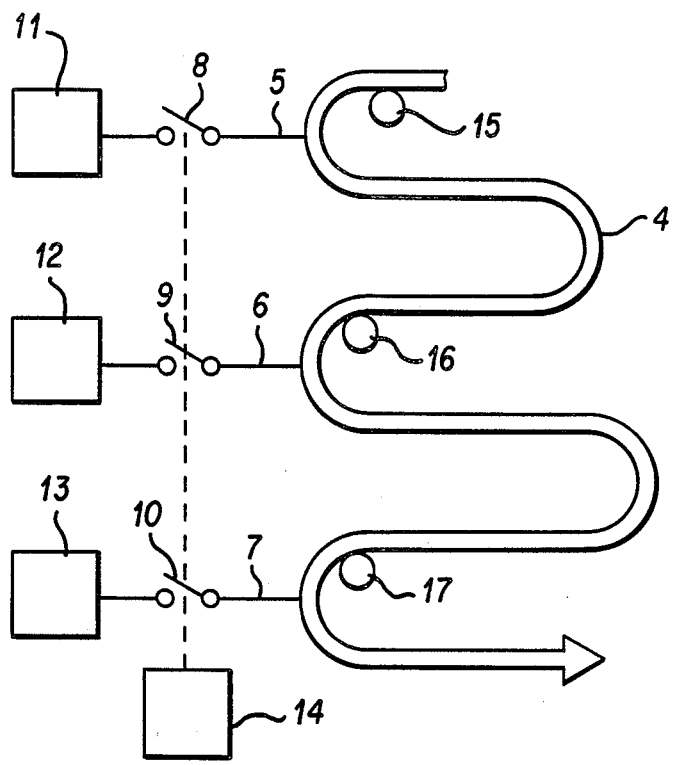

United States Patent [19]

Borup et al.

[11] Patent Number: 4,866,711
[45] Date of Patent: Sep. 12, 1989

[54] METHOD OF MULTIPLEX/DEMULTIPLEX PROCESSING OF INFORMATION AND EQUIPMENT FOR PERFORMING THE METHOD

[75] Inventors: Gottlob Borup, Olstykke; Flemming H. Pedersen, Bagsvaerd, both of Denmark

[73] Assignee: Christian Rovsing A/S af 1984, Ballerup, Denmark

[21] Appl. No.: 94,453

[22] Filed: Sep. 9, 1987

Related U.S. Application Data

[63] Continuation-in-part of Ser. No. 836,120, Mar. 4, 1986, abandoned.

[51] Int. Cl.⁴ .............................................. H04J 3/04
[52] U.S. Cl. .................................... 370/108; 370/112
[58] Field of Search ................. 370/112, 108, 55, 109, 370/10, 85, 86, 87, 4; 455/606, 617, 619

[56] References Cited

U.S. PATENT DOCUMENTS

| | | | |
|---|---|---|---|
| 3,541,265 | 11/1970 | Greefkes | 370/108 |
| 3,571,516 | 3/1971 | Ohyama et al. | 370/112 |
| 3,763,318 | 10/1973 | Ross et al. | 370/112 |
| 4,513,427 | 4/1985 | Borriello et al. | 370/108 |
| 4,630,256 | 12/1986 | Albanese | 370/85 |

OTHER PUBLICATIONS

A. Davidson, S. M. Faris and H. C. Jones, "Time Domain Multiplexer-Driver and Receiver for Chip-to-Chip Communication", IBM Technical Disclosure Bulletin, vol. 21, No. 11, Apr. 1979, pp. 4705-4710.

Primary Examiner—Douglas W. Olms
Assistant Examiner—Melvin Marcelo
Attorney, Agent, or Firm—Lowe, Price, LeBlanc, Becker & Shur

[57] ABSTRACT

An information processing system includes a transmitter, which converts parallel information to serial, and a receiver, which receives the serial information and reconverts the same to parallel for use by a further processing unit. Structure is provided to eliminate a requirement for a separate transmission line for transmission of a synchronization signal for synchronizing the receiver to function properly in receiving information. More coupling points are provided at the transmitter than at the receiver, for coupling information into the serial information path. The additional coupling points are used to transmit flag information together with the data being transmitted, the flag information being used to produce a detection signal. The detection signal is used to gate the received signals from a receiving signal path to various storage devices, thus converting the received serial information to parallel form in response to the flag signals which are serially transmitted together with the data.

19 Claims, 12 Drawing Sheets

METHOD OF MULTIPLEX/DEMULTIPLEX PROCESSING OF INFORMATION AND EQUIPMENT FOR PERFORMING THE METHOD

This is a continuation-in-part of application Ser. No. 836,120, filed Mar. 4, 1986, now abanboned, for "A METHOD OF MULTIPLEX/DEMULTIPLEX PROCESSING OF INFORMATION AND AN APPARATUS FOR CARRYING OUT THE METHOD" by Gottlob Borup and Flemming H. Pederson.

The invention concerns a method for information multiplex processing, said method comprising conversion of information signals represented in parallel into information signals propagating serially along a first energy propagation path with predetermined mutual time distances, conversion of a plurality of information signals transmitted serially along a second energy propagation path with predetermined mutual distances into information signals in parallel, brief transmission of electric energy to predetermined locations along the first energy propagation path at points of time representing the time difference between a pair of serial information signals on the first energy propagation path provided at respective locations and the propagation time of the last-mentioned signals between the same two locations, respectively, registering the energy state at a plurality of locations along the second energy propagation path at points of time representing the difference between the arrival times of a pair of information signals at a pair of respective locations along the second energy propagation path, said first energy propagating path and said second energy propagation path being operatively interconnected.

Such a method is known e.g. from the U.S. Pat. Specification No. 3 763 318. This method however, is vitiated by the drawback that an additional transmission line is needed for transport of a synchronization signal in order for the receiver to be able to receive the information correctly. This means that the transmitter and the receiver have to be adjusted accurately with respect to each other, which excludes the possibility of coupling a large number of transmitters and receivers to a common transmission bus, i.e. a so-called multidrop system.

The object of the invention is to provide a method of the above-mentioned type, which makes it possible to use the known multiplex/demultiplex art in a multidrop system, and which moreover enables unprecedented high transmission rates.

This object is achieved in that the number of locations on the first energy propagation path is larger than the number of locations on the second energy propagation path, and that some of the locations on the first energy propagation path are used for transmission of flag information signals serially with the information signals, and that the flag information signals are received and used for producing a detection signal transmitted with a certain propagation rate to gate means connected to respective locations of the second energy propagation path.

It will be appreciated that the said energy propagation paths may be adapted for various forms of energy propagation. The invention will be explained in the detailed part of the specification under the assumption that microwave energy is propagated, but it will be appreciated that the invention is just as useful in connection with transmission of acoustic energy, optical energy or other energy where information signals can be propagated as a travelling wave along the energy propagation path.

The said detector signals and gate signals need not be of the same energy type as the one propagating along the energy propagation paths. In a preferred embodiment, the detector signal and the gate signal are also transmitted as microwave energy, which is preferably transmitted in serial form to the detector means and gate means, respectively, in sequence.

As will appear from the foregoing, the invention provides for unprecented information rates, and it is therefore particularly expedient that the information signals are represented by individual electric oscillations with a frequency spectrum as narrow as possible. When energy propagation paths having uniform energy propagation parameters are used and when the paths are terminated reflection-free, an optimum transmission rate can be obtained. When information is to be transmitted from one location to another, this usually involves serial transmission between two locations, whereby the parallel to serial conversion according to the invention is used for transmission of the information, while the serial to parallel conversion according to the invention is used for reception of the information.

The transmission rate can be increased considerably when the information signals are substantially represented by a single electric oscillation with frequency spectrum as narrow as possible around a fundamental frequency. This provides the additional advantage that the various electronic components used in the circuits are also adapted to work in the corresponding narrow frequency spectrum, so that the components are both inexpensive and more immune to external noise signals than is the case of components for transfer of pulses.

The invention also comprises a transmitter circuit and a receiver circuit for performing the method of claim 1 or 2. As appears from claims 3 and 4, these circuits are characterized by being formed as microstrip circuits for support of microwave energy with a narrow frequency spectrum, said circuit being so adapted that flag information signals are produced serially with the transmitted data signals and are received for control of the receiver function. As appears from the comments below, precisely these features have a surprising effect in relation to what it has been possible to obtain with the prior art in the past.

Preferably, the coupling points comprise a plurality of evenly distributed directional couplers which are connected to drive circuits and gate circuits in the transmitter and receiver circuits, respectively, the directional couplers being dimensioned to cooperate in the support of the signals with the narrow frequency spectrum. When the coupling coefficients of the directional couplers are different, uniform signal levels can be obtained throughout the transmitter and receiver circuits.

The drive circuits and the gate circuits preferably comprise a dual gate MESFET transistor, whose one gate input is driven from an internal transmission line, which is preferably step-shaped.

When the transmission line is stepped opposite each tap to a respective transistor, the gate electrodes of the transistors will receive trigger signals with substantially uniform amplitudes.

The receiver moreover comprises an automatic amplifier loop, the amplitude of the first receiving flag bit being utilised for regulating the gain of an amplifier which receives both flag and data signals with a certain delay. This compensates for the situation when signals received from various transmitters have different amplitudes. The said amplifier loop is reset by the trigger signal in the receiver which detects the signal conditions at the predetermined points of time.

Finally, the invention concerns a data transmission system comprising means for conversion of information signals represented in parallel into information signals capable of propagating serially along a first energy propagation path with predetermined mutual time distances, means for conversion of information signals transmitted serially along a first energy propagation path with predetermined mutual time distances into information signals in parallel, a plurality of coupling points along the first energy propagation path, each of said coupling points being designed to receive an energy amount defining an information signal represented in parallel, via a respective gate circuit in response to gate signals, means designed to produce and transmit the gate signals so that said energy amounts are briefly transferred to respective coupling points at points of time representing the time difference between the predetermined mutual time distance between a pair of information signals provided at respective coupling points and the propagation time of the latter signals between the same two coupling points, respectively, a plurality of signal taps along the second energy propagation path, each of said signal taps being connected to a respective detector circuit, means for producing and transmitting a detection signal for the detection means so that the energy state at the signal taps is registered at points of time representing the difference between the arrival of a pair of information signals at a pair of respective signal taps along the second energy propagation path.

The system is characterized in that the number of locations on the first energy propagation path is larger than the number of locations on the second energy propagation path, and that some of the locations on the first energy propagation path are used for transmission of flag information signals serially with the information signals, a circuit being provided in connection with the second energy propagation path to receive the flag information signals and to produce, in response thereto, said detection signal for the detector means.

This system makes it possible to provide mutually identical parts of the energy propagation paths in the transmitter and the receiver, respectively, when the trigger signals propagate in mutually opposite directions through the said internal transmission lines. This obviates any form of trimming of the transmitter and receiver circuits as the signal properties of the circuits are unambiguously determined by the geometry of the microstrip circuits, which can in practice be shaped very accurately. This is an important argument for the provision of an efficient and fast multidrop system according to the invention, which may be constructed as appears from claim 18.

The technique described above lends itself particularly well to microwaves, where not only the mentioned energy propagation paths but also feed paths for the detector signals and the gate signals, respectively, can be established by means of microstrip circuits which are very inexpensive to produce. When the invention is used in connection with microstrip circuits, transmission rates of the order of 1 GHz can be obtained by relatively simple components, and transmission rates of the order of 10 GHz can be achieved by means of more advanced microwave components. If optical energy propagation is used, even greater transmission rates can be obtained, which will probably be too expensive with the present technology, but is easily feasible. The invention is therefore also very relevant in connection with the development of optical computers which is presently taking place.

Figure 2:
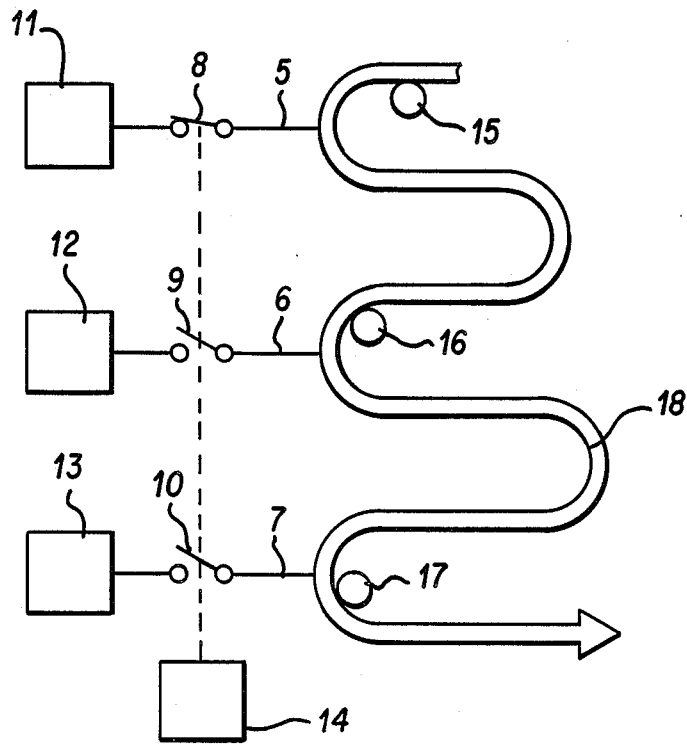
Figure 3:
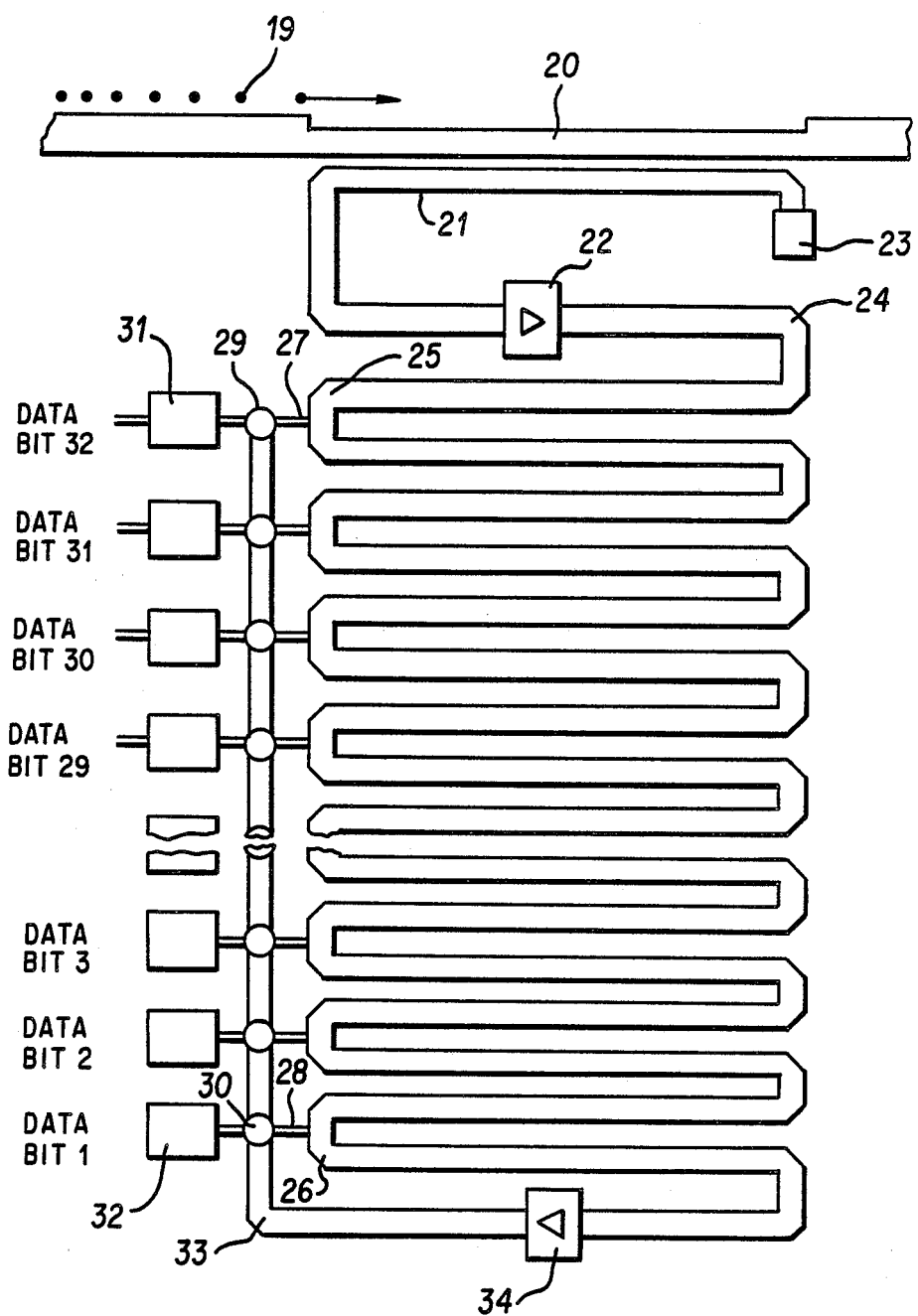
Figure 4:
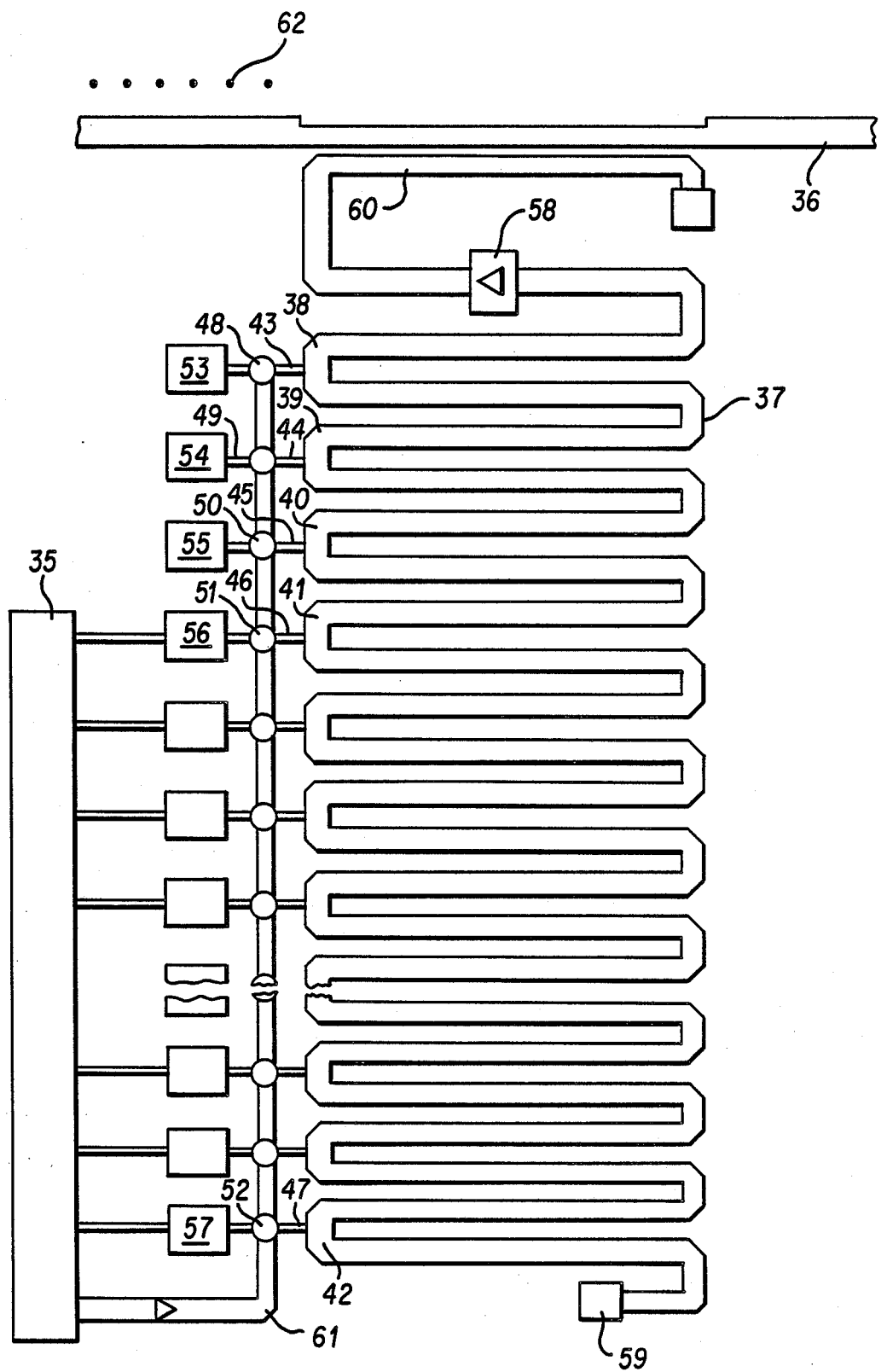
Figure 5:
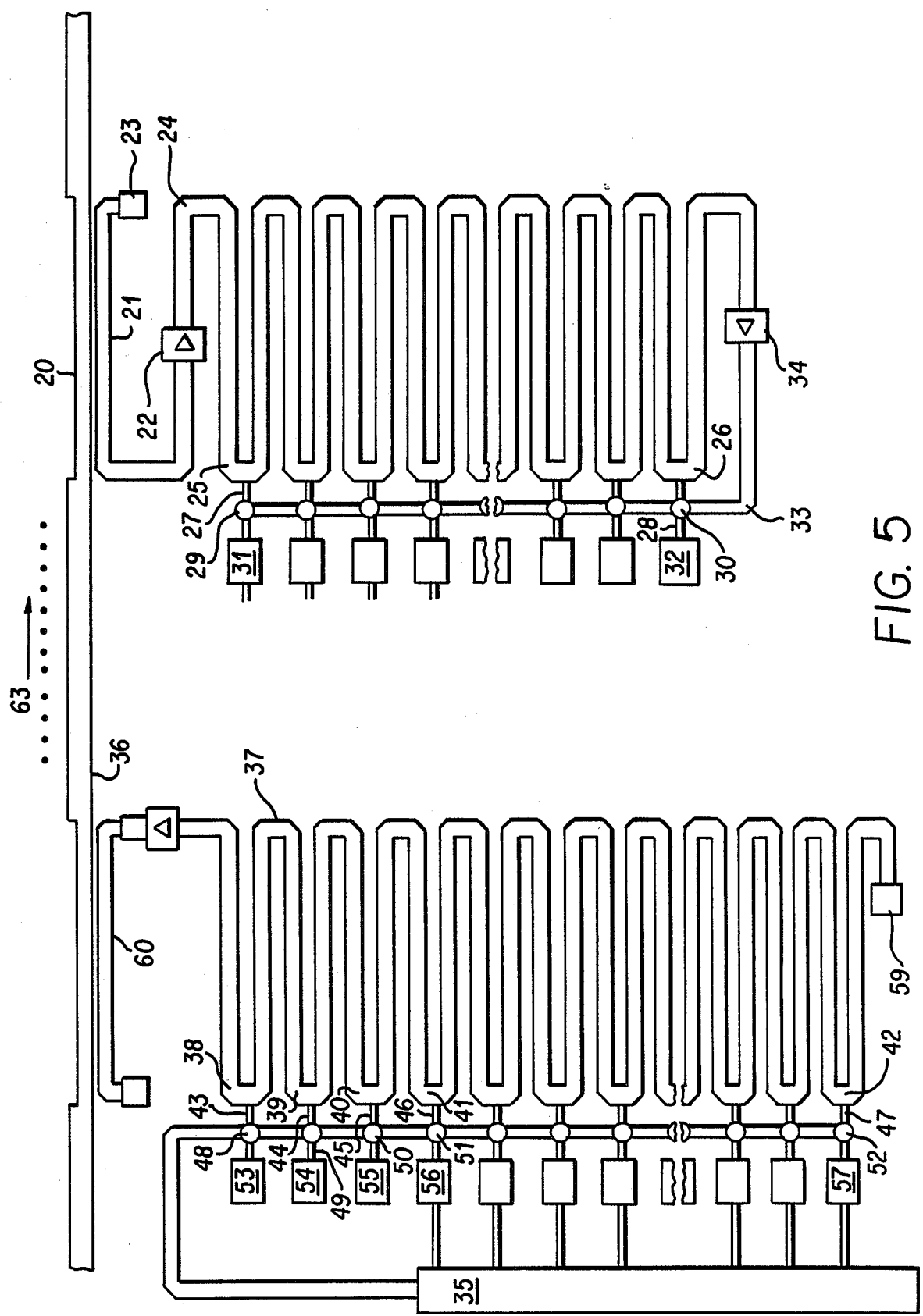
Figure 6:
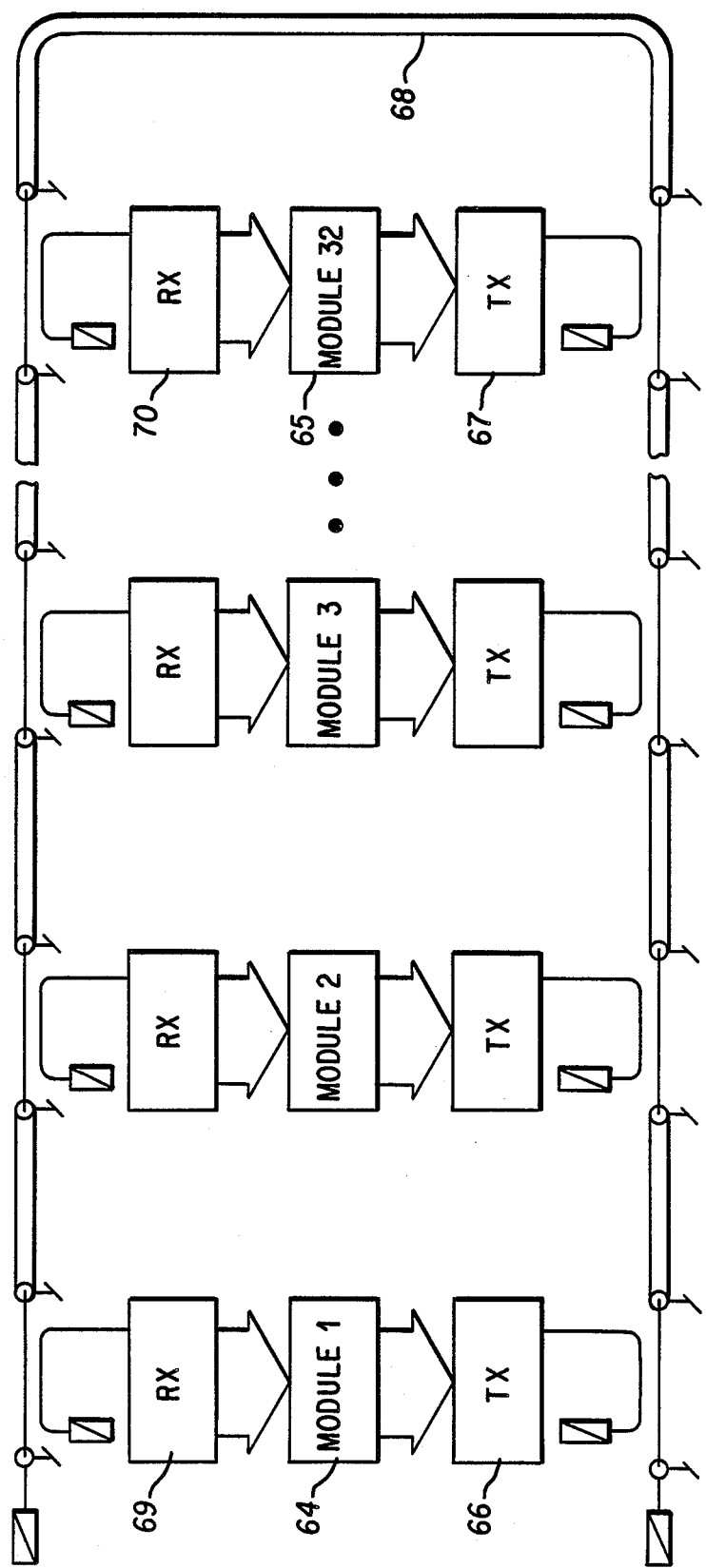
Figure 7:
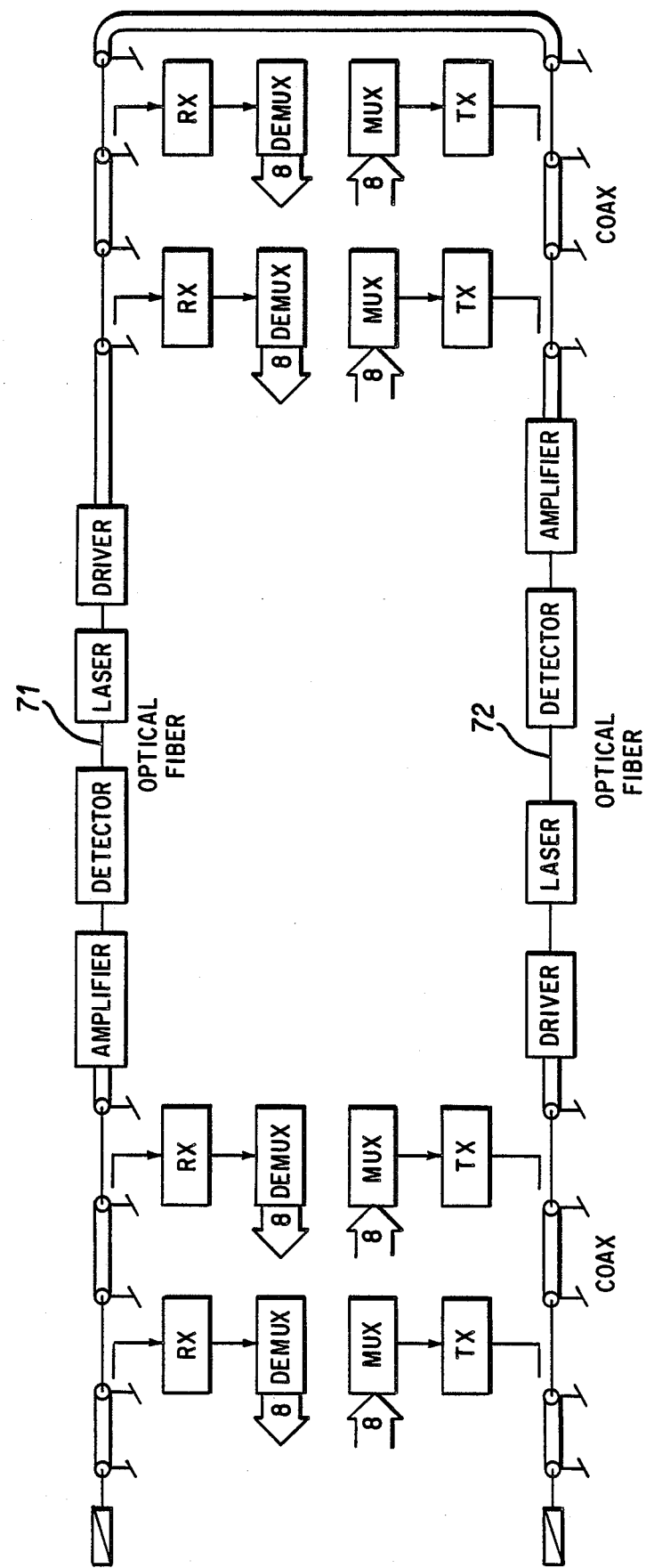
Figure 8:
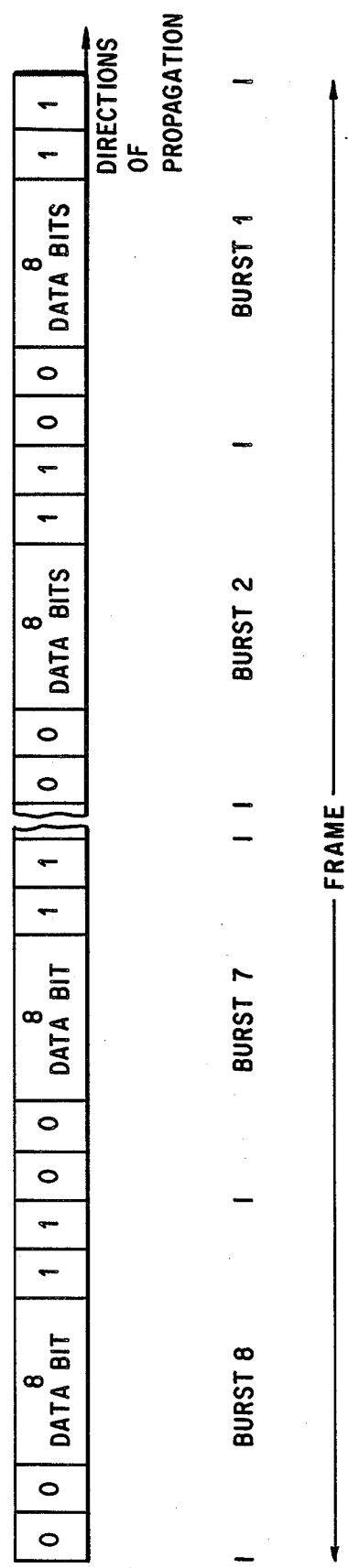
Figure 9:
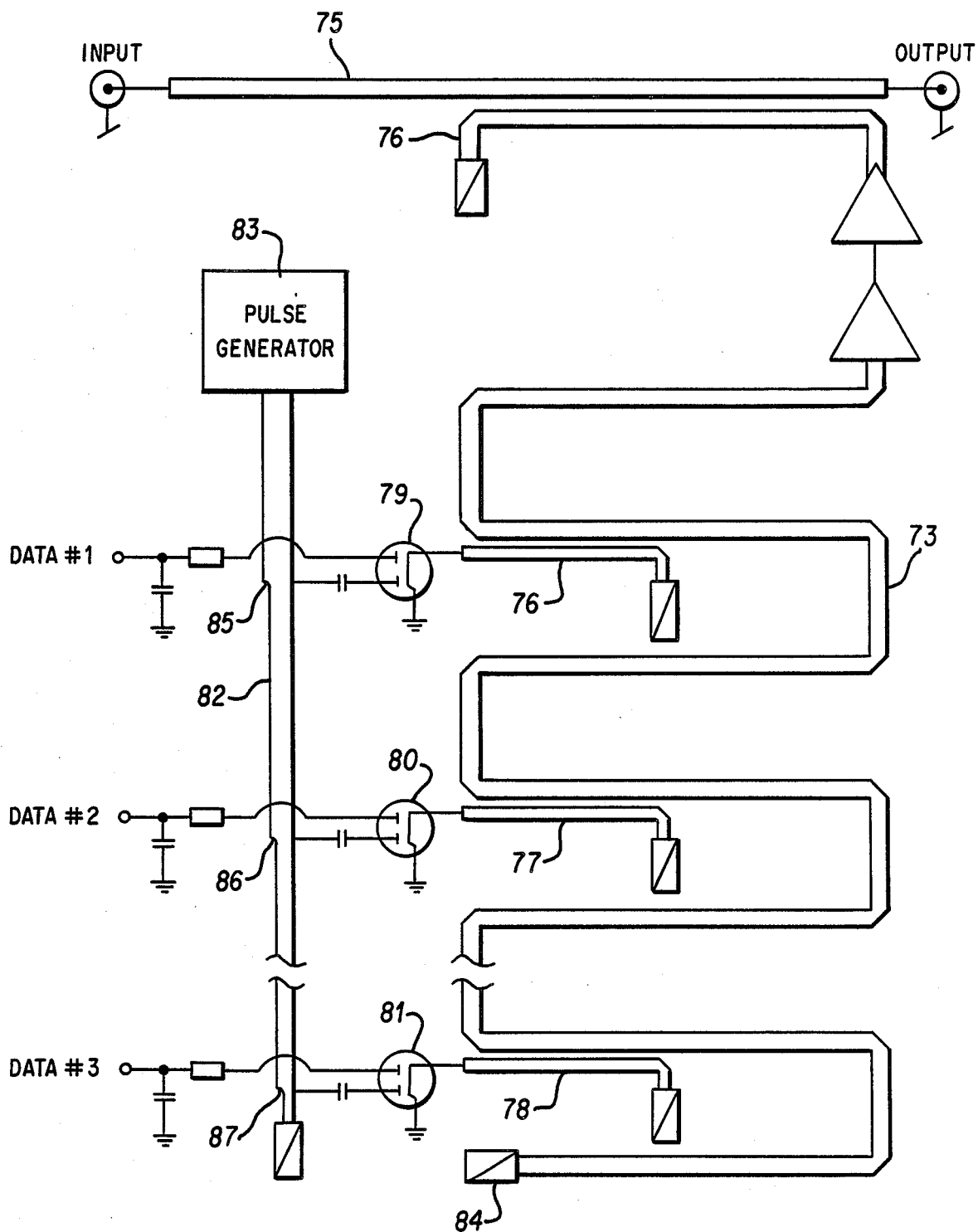
Figure 10:
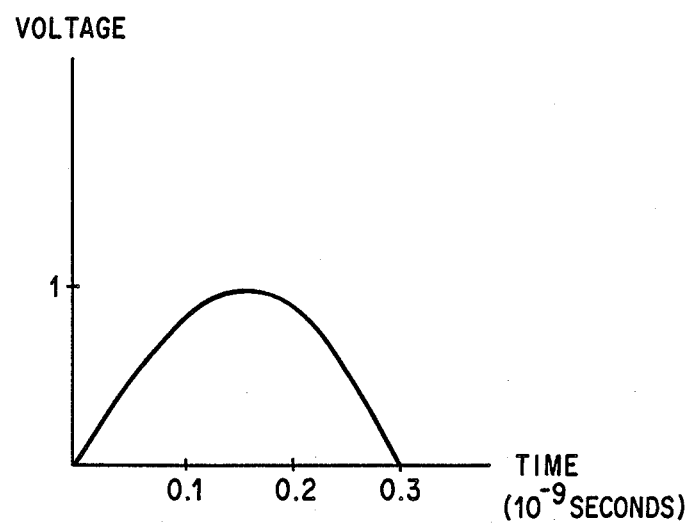
Figure 11:
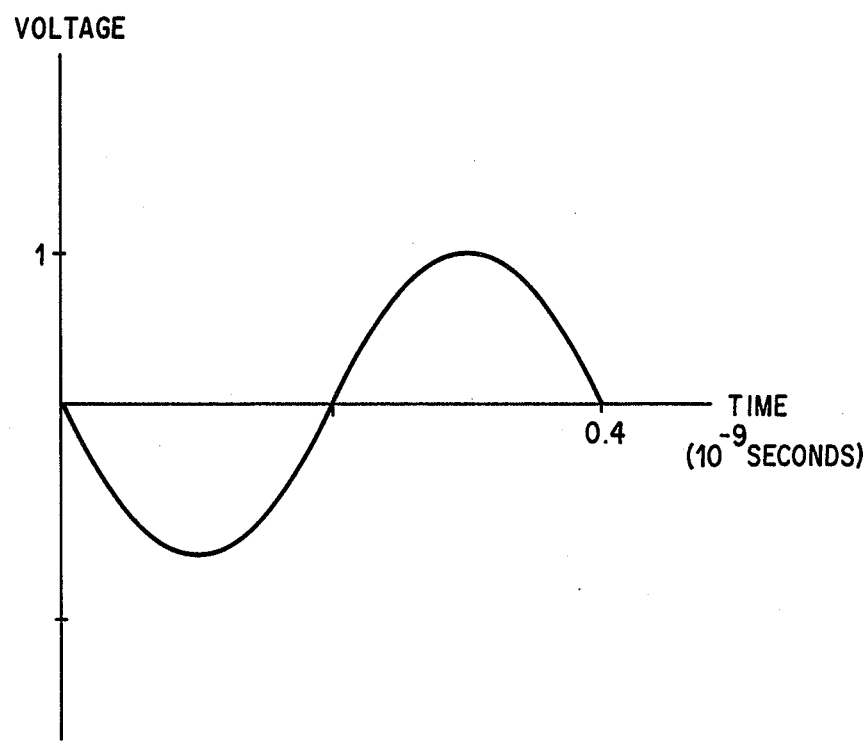
Figure 12:
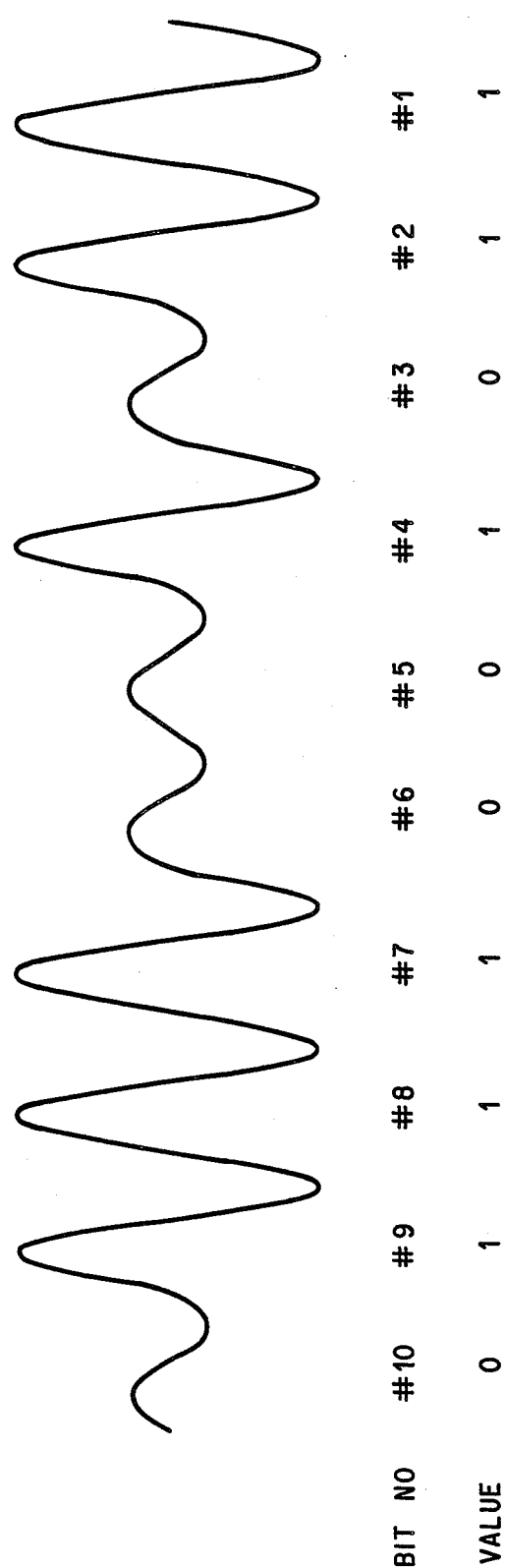
Figure 13:
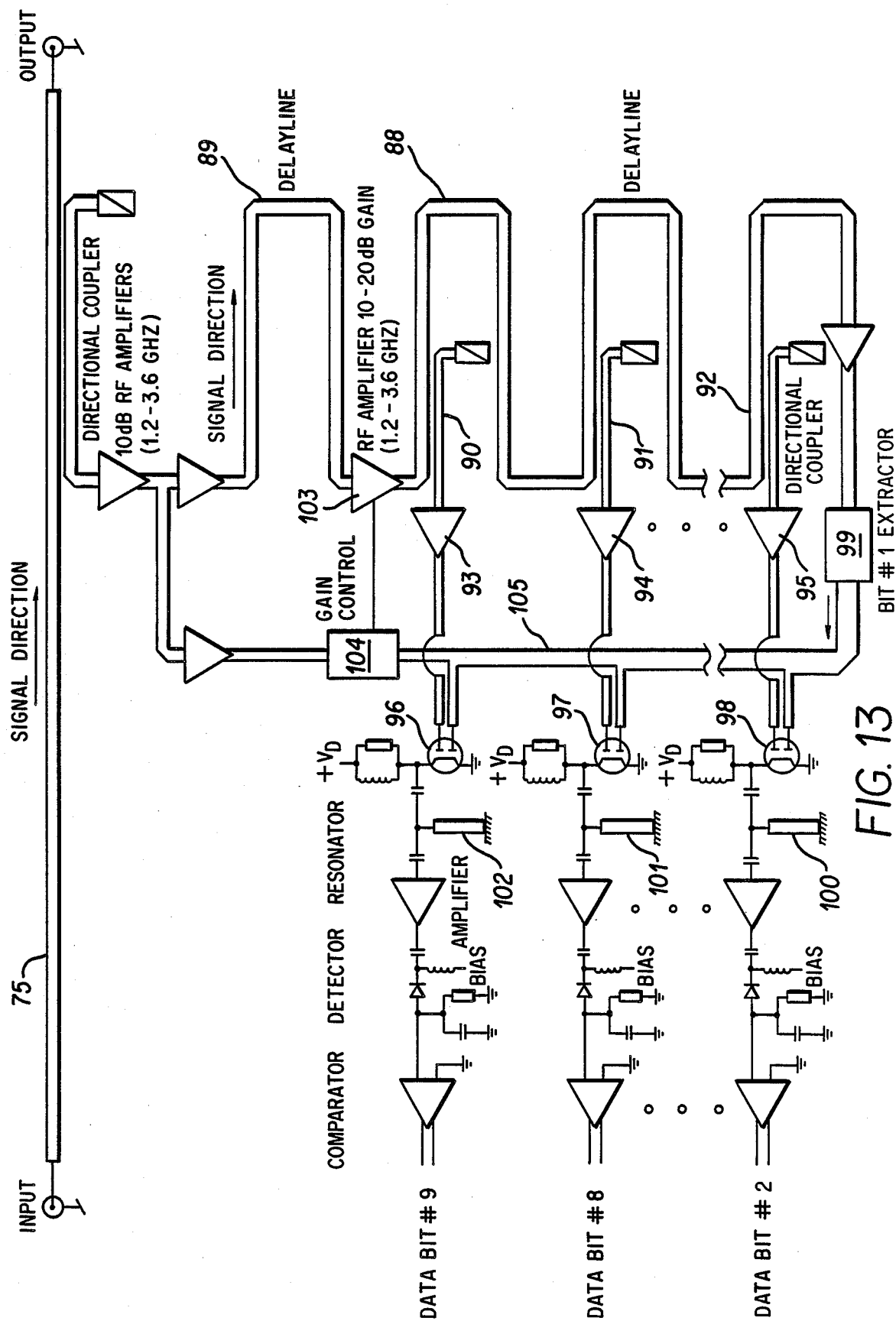
Figure 14:
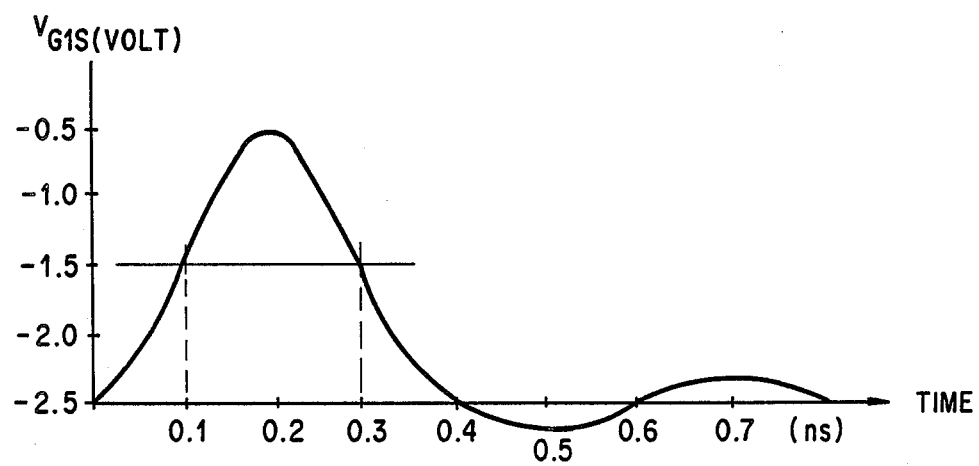
Figure 15:
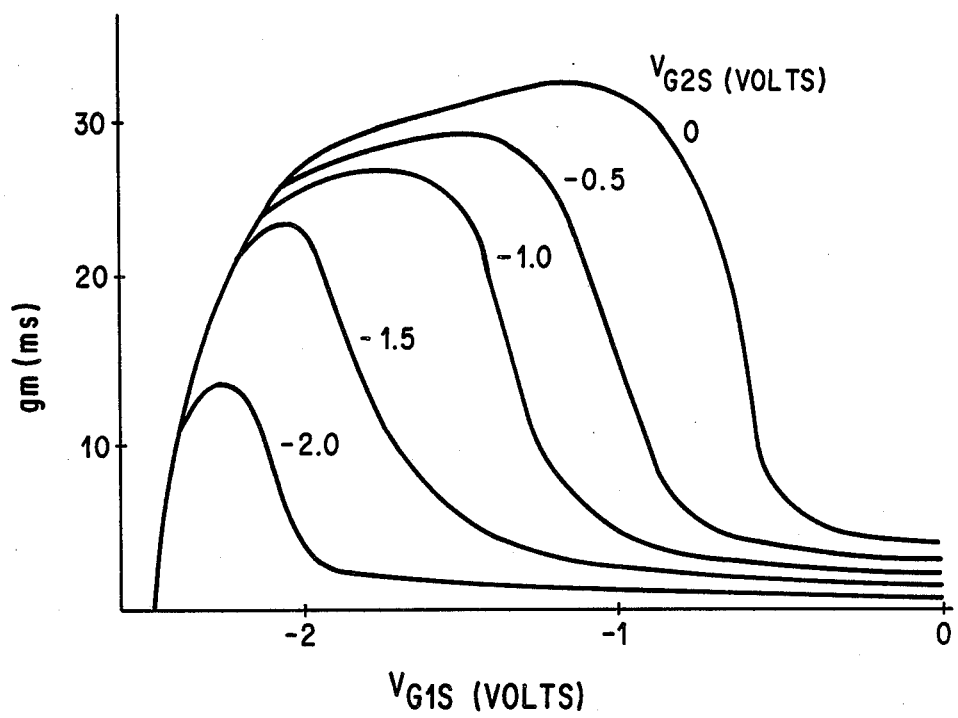

The invention will be explained more fully below with reference to the drawing, in which FIGS. 1–2 are sketches explaining the known principle on which the invention is based, FIG. 3 shows a preferred embodiment of a receiver circuit according to the invention, FIG. 4 shows a preferred embodiment of a transmitter circuit according to the invention, FIG. 5 shows a preferred embodiment of a data transmission system according to the invention, FIG. 6 shows a use of the system shown in FIG. 5, FIG. 7 shows a modification of the system shown in FIG. 5, FIG. 8 shows a composition of data used in connection with the explanation of the circuits shown in FIGS. 9 and 13, FIG. 9 shows some preferred details in an embodiment of the transmitter circuit of the invention, FIGS. 10, 11 and 12 show curve shapes belonging to the circuit shown in FIG. 9, FIG. 13 shows details in an embodiment of the receiver circuit according to the invention, while FIGS. 14 and 15 show a curve shape and characteristics, respectively, of the circuit shown in FIG. 13.

Initially, a known principle used in the invention will be explained, said principle being known in principle e.g. from the said U.S. patent specification.

FIG. 1 shows an energy propagation path 4, which has taps 5, 6 and 7 connected to holding circuits 11, 12 and 13, respectively, via switches 8, 9 and 10, respectively. The switches are controlled by a control signal from a circuit 14. The numerals 15, 16 and 17 indicate information energy propagating along the energy propagation path 4, the mutual time distance between the information energy corresponding to the length of the path between the taps 5, 6 and 6, 7. As appears from FIG. 1, the information energies 15, 16 and 17 are equidistantly spaced from the taps 5, 6 and 7, respectively, and it will accordingly be appreciated that the information energy can be transferred to the holding circuits 11, 12 and 13, respectively, if the switches 8, 9 and 10 are switched on at the same time precisely when the information energy is present opposite the taps 5, 6 and 7.

FIG. 2 shows almost the same as FIG. 1, but with the propagation path 4 replaced by an energy propagation path 18 differing from the energy propagation path shown in FIG. 1 in that the lengths of the path, measured between the taps 5, 6 and 6, 7, respectively, are reduced somewhat with respect to the situation in FIG. 1. This entails that it will take a little longer for the information energy 15 to arrive at the tap 5 than is the case for the information energy 17 shown in FIG. 2 opposite the tap 7. However, it will be appreciated that correct transfer of the information energy to the holding circuits 11, 12 and 13 can be obtained by arranging the propagation delay for the switches 10, 9 and 9, 8, respectively, in a manner such that the propagation delay difference precisely compensates for the time shift in the arrival of the information energies at the taps. It will also be appreciated that adaptation of the detection signal delay to the individual switches and of the propagation delay of the information energy between the individual taps may provide conversion of serial information to parallel information applying to any preknown pattern of serial information, i.e. preknown time distances between the individual information signals. A quite similar effect can be obtained by parallel-to-serial conversion, which will appear from the following description of some embodiments of the invention.

Microwave circuits will be used by way of example in the description of the various embodiments, designed to support electromagnetic oscillations with a relatively narrow frequency spectrum, which involves incredibly low production costs and very high transmission rates in the order of 1–10 GHz.

FIG. 3 shows a microwave circuit for serial-to-parallel conversion of serial information symbolized by 19 and propagating in the direction of the arrow along a microwave strip 20. The serial information is transferred via a directional coupler 21 to an amplifier 22, the directional coupler 21 being terminated reflection-free at 23. The output signal of the amplifier 22 is controlled so that well-defined signals are transmitted to an energy propagation path 24 consisting of 32 loops, e.g. the loops 25 and 26, each of which has a tap such as 27 and 28, which are connected to holding circuits 31 and 32, respectively, via respective microwave switches 29 and 30. The microwave switches respond to a control pulse propagating on a microwave strip 33 produced by a pulse extractor circuit. The circuit 34 amplifies only the first bit in a burst and suppresses the following bits in the burst, as explained later in more detail. This first oscillation will propagate along the microstrip 33, and this oscillation arrives first at the microwave switch 30 and later at the microwave switch 29. In the embodiment shown there will thus be an increasing time delay for the actuation of the switches as seen from the switch 30 to the switch 29. If it is assumed that the serial information 19 was transmitted with equidistant time distances, expansion would actually happen on reception if the loops 25 . . . 26 were of the same length, and if the time delays along the microstrip 33 between the individual microwave switches 30 . . . 29 were the same. FIG. 3 shows the serial information 19 with dissimilar time distances, but it is also shown in FIG. 3 that the loop 26 is longer than the loop 25, thereby compensating for the dissimilar time distances in the information signal. Such a combination might also be obtained with loops of the same length by providing dissimilar propagation conditions for the control pulse on the microstrip 33 between the individual microwave switches.

FIG. 4 shows a preferred embodiment of a transmitter circuit according to the invention, where parallel information from a data processing unit 35 is to be converted into serial information to be transmitted on an energy propagation path 36. The embodiment shown in FIG. 4, like the one shown in FIG. 3, is designed as a microwave circuit with the energy propagation path being designed as microstrips arranged to support an electromagnetic oscillation with a narrow frequency spectrum. More particularly, an energy propagation path 37 is provided, consisting of a plurality of microstrip loops, such as the loops 38–42, each of which having a tap 43–47, respectively, connected to holding circuits 53–57, respectively via respective microwave switches. The holding circuits 53, 54 and 55 contain predetermined information values which are to represent a flag signal in the transmission, said flag signal propagating according to the invention in front of the data signal proper which originates from the unit 35. If, for example, it is imagined that the microwave switches 48, 49 and 50 are switched on at a given moment, information representing charges will simultaneously be transferred to the taps 43, 44 and 45, respectively. These charges will immediately propagate in opposite directions along the energy propagation path 37, so that, according to the superposition principle, a number of flag signals will be produced, propagating partly in a direction toward an amplifier 58 and partly toward a reflection-free termination 59. It is thus noted that the signal propagation path 39 in the transmitter circuit in FIG. 4 has three delay loops (corresponding to the holding circuits 53, 54 and 55) more than the signal propagation path 24 in the receiver in FIG. 3. The signal is transferred from the amplifier 58 via a directional coupler 60 to the microstrip 36. It will accordingly be appreciated how the parallel information for the unit 35 is converted into serial information, the parallel information being transferred from the unit 35 to the holding circuit 56. . .57; the unit 35 producing a control pulse on a microstrip 61, propagating to all the microwave switches. Owing to the bandwidth of the amplifier 58 and the inherent filter effect of the microstrip it is desirable to produce uniform pulses, which is preferably provided for in that the microstrip loops 38, 39 and 40, 41 . . . 42 are of the same length, and in that the microstrip lengths between the microwave switches are of the same length. However, owing to the propagation time of the pulse on the microstrip 61 this entails that serial information propagating on the microstrip 36 in the direction of the arrow and represented by 62 will be compressed for a period of time corresponding to the propagation time of the control pulse along the microstrip 61.

FIG. 5 shows a first embodiment of the data transmission system according to the invention, which is in principle a coupling of the circuits shown in FIGS. 3 and 4. Therefore, the reference numerals used in FIGS. 3, 4 and 5 are the same, it being stressed that the only, but very essential differences between FIG. 5 and the two other figures are that the microstrip 61 is so arranged that the control pulse for the microwave switches propagates in a direction opposite to the one appearing from FIG. 4, and that the energy propagation loops 25 . . . 26 in the embodiment shown in FIG. 2 are shaped substantially identically.

Because the microwave switches 48, 49, 50, 51 . . . 52 are now actuated in the opposite order, the produced serial information signal 63, which propagates in the direction shown by the arrow in FIG. 5, will be somewhat expanded corresponding to the propagation time for the pulse on the microstrip 61. When, as mentioned, the loops 25. . .26 display uniform signal energy propagation time, and this corresponds to the propagation time along the loops 38 . . . 42, the information signals 63 will be transferred at the exact moment to the holding circuits 31 . . . 32 because of the compression brought about by the fact that the pulse on the microstrip 33 propagates with a certain time delay so that the microwave switch 30 is actuated a little before the microwave switch 29 is actuated.

It will then be appreciated that in the data transmission system according to the invention it is the geometry of the microwave circuits which are decisive for the optimum function. It will also be appreciated that this geometry and/or the energy propagation conditions for the pulses on the microstrips 61 and 33 can be changed, so that the data transmission system can also serve as a cryptograph.

As appears from FIG. 5, the shown embodiment is designed to convert 32-bit words, which involve a relatively long energy propagation path. Certain transmission systems work with 128-bit words, which would require a very long energy propagation path. However, it is observed that since the invention involves an improvement in the working rate by at least one order by the use of microwave circuits it is sufficient to arrange the circuit according to the invention to for example a 16-bit word and then to combine a plurality of 16-bit words in conventional manner to for example a 128-bit word. When this combination can be handled through the prior art it is possible, by combining said prior art with the invention, to obtain a hybrid circuit which in this example is 16 times faster than the known circuit.

FIG. 6 shows a very important use of the data transmission system shown in FIG. 5. FIG. 6 shows a plurality of data processing modules 64 . . . 65, each of which comprises a transmitter in the form of a parallel-to-serial converter 66 . . . 67 operatively connected to a common transmission line 68, preferably in the form of a co-axial cable, via directional couplers. The cable 68 is also connected to receivers for the data processing modules 64 . . . 65 via directional couplers, and these receivers are designed as serial-to-parallel converters 69 . . . 70. The system shown in FIG. 6 can be called a multidrop system, i.e. a system where many transmitters and many receivers are coupled to the same common transmission bus 68. Such a system is to enable coupling of additional transmitters and receivers with an arbitrary physical location along the bus, and it is therefore absolutely necessary that the flag signals are transmitted in connection with the data signals on the same bus, so that flag signals and data signals have a uniform propagation rate along the bus. For example, the system known from the U.S. Pat. Specification No. 3,763,318 is just useful for point to point transmission since this known system works with a separate synchronization line, so that the time delays along the synchronization and data lines are to be adapted very accurately and exclude in practice a configuration e.g. like the one shown in FIG. 6.

When the synchronization and data signals are transmitted serially via the same propagation medium, the system of the invention also makes it possible to introduce e.g. optical transmission paths in the multidrop system shown in FIG. 6. An example of this is shown in FIG. 7, where the reference numbers 71 and 72 symbolize a light conductor with associated laser and detector. A practical use of the circuit shown in FIG. 7 might be in an aircraft where all the computers in the cockpit are interconnected via ordinary transmission lines, while signal transmission to and from the tail unit of the aircraft can take place through light conductors.

Some details of some embodiments of the invention will be explained below, and the data configuration shown in FIG. 8 will be used in connection with this explanation, viz. 8 data bits which is preceded by two "1"s followed by two "0"s. The 8 data bits with associated "1"s and "0"s are called a burst. The circuit shown in FIG. 9 corresponds in principle to the circuit of FIG. 4. The signal propagation path 73 is thus connected to a signal bus 75 via a directional coupler 74 and comprises a plurality of delay loops in the form of a microstrip. The coupling to the delay loops is established by a plurality of directional couplers 76, 77 and 78, whose one end is terminated reflection-free, the other end being connected to a dual gate field effect transistor 79, 80 and 81, respectively. One grid electrode of the transistors is connected to a data input Nos. 1–10, the other grid of the transistors being connected to the tap along an internal transmission line 82, which is driven by a pulse generator 83. The transmission line 82 corresponds to the transmission line 61 from FIG. 4 and 61 from FIG. 5 and is thus used for transmission of the signal which transfers, via the transistors, an electric charge to the directional couplers 76–78 in response to the signal on the data inputs.

The directional couplers 76–78 have a great importance since an input pulse will give rise to a fundamental oscillation at a predetermined frequency of the order of 1 to 10 GHz. FIG. 10 thus represents a pulse which is transferred to the directional couplers, and which causes production of an oscillation (see FIG. 11) on the signal propagation path 73, said oscillation moving toward the bus 75 and representing the serial output signal. The advantage of using directional couplers is that energy is just transmitted toward the bus, and that the energy is not reflected, but only damped quite little when passing others of the directional couplers. This technique makes it possible to construct a multiplexer with many parallel inputs, e.g. 32 inputs.

As appears from FIG. 9, the internal transmission line 82 is stepped at 85, 86, 87, respectively, opposite taps to the gate electrode of the transistors. This provides the advantage that all transistors receive substantially uniform pulse amplitude on the respective gate electrodes. Another essential property, which is not very clear in the drawing, is that the coupling coefficients for the directional couplers 76–78 are different as the directional coupler 76 has a lower coupling coefficient than the directional coupler 78. This means that the directional coupler 78 generates a relatively stronger pulse on the energy propagation path 63 than is the case with the directional coupler 76, but since part of the pulse originating from the directional coupler 78 is lost in the reflection-free termination of the other directional couplers, the microstrip circuit may be so dimensioned that the waves transmitted to the bus 75 have substantially uniform amplitude.

FIG. 12 shows a typical example of a signal course, as may occur on the bus 75. It appears from FIG. 12 that logic 1 is represented by a whole oscillation with high amplitude, while logic 0 is theoretically represented by non-occurrence of an oscillation, but manifests itself in practice as an oscillation with low amplitude originating from the adjacent oscillations; undesirable reflection, etc. The two last bits of a burst are provided by a pause in the transmission.

FIG. 13 shows some details in an embodiment of the receiver circuit according to the invention, said circuit corresponding in principle to the one which was explained in connection with FIG. 3. The transmission bus is shown with the reference number 75 from FIG. 9, so that the signal shown in FIG. 12 may conceivably arrive at the signal propagation path 88, which is constructed as a microstrip circuit adapted to support an electromagnetic oscillation with a relatively narrow frequency spectrum. By means of directional couplers 90, 91 . . . 92, a signal is taken from the signal propagation path 88 via amplifiers 93–95 to one gate electrode on respective dual gate field effect transistors 96–98. (In the circuit shown in FIG. 13, a triangle generally symbolizes an amplifier circuit). Similar to what was explained in connection with the directional couplers 76–78 in FIG. 9, the directional couplers 90–92 have a varying degree of coupling, so that signals with substantially uniform amplitude are transferred to the respective grid electrodes on the transistors 96–98. The transistors 96–98 transfer a signal only if the other gate electrode receives a trigger signal of approximately the same size as the signal on the other gate electrode. The trigger signal is produced by means of a pulse generator circuit 99 connected to the signal propagation path 88 via an amplifier. The circuit 99 operates as a pulse extractor circuit which just transmits and amplifies the first one of the oscillations on the input, while the subsequent data bits are blocked. During the last two bits of the burst (see FIG. 8) the circuit recovers for transmission again of a single oscillation. The microstrip circuit can therefore be so dimensioned that the oscillation transmitted through the circuit 99 arrives at one gate electrode of the transistor precisely simultaneously with the second gate electrode receiving the first actual data bit via the directional coupler 92 and the amplifier 95. This results in generation of a pulse in the resonator circuit coupled to the transistor 98, consisting of the microstrip 100 (and corresponding microstrips 101, 102 in connection with the other bit positions), and then the oscillation is detected by means of an integrating detector, as appears from FIG. 13.

By means of comparators, it is decided whether the signal represented logic 0 or logic 1. It is observed that the integrator of the detector has time to integrate over a whole burst period before it must be ready to detect the next bit, since an integrator is provided for each data bit in a burst.

FIG. 14 represents the trigger pulse which is produced by the circuit 99. This circuit is also so adapted that it cannot transmit a new pulse after the actual burst has terminated.

FIG. 15 represents the transconductance of the transistors 96–98, from which it will be seen that the input signals to the gate electrodes should be substantially uniform and of the order of 1 volt peak to peak in order to work efficiently. It will therefore be appreciated that it is important that the receiving data signal is caused to have essentially constant amplitude, which is obtained as described below.

The energy propagation path 88 comprises a delay path 89 connected to the directional couplers 90–92 via an adjustable amplifier 103. The amplifier 103 is controlled by a regulating circuit 104 receiving the data signal before this has been delayed through the delay path 89. The circuit 104 can thus sense the amplitude of the receiving oscillation and adjust the gain of the amplifier 103 on the basis of this, so that both data and flag signals are amplified to a predetermined level before the signal continues down through the propagation path 88. It is noted that the circuit 104 is also connected to the internal transmission line 105 so that the circuit 104 receives a pulse from the circuit 89 precisely when the data signals have passed the amplifier 103. This resets the circuit 104, so that it is ready to receive a new flag signal from the bus 75.

As has been explained before, the entire microstrip circuit is dimensioned to support a signal with a frequency spectrum as narrow as possible around a fundamental frequency. In addition, all other components are adapted to work within this bandwidth so that in particular the receiver circuit (and the transmitter circuit from FIG. 9) is very immune to noise. The extensive use of microstrip circuits makes it possible for the transmitter and receiver to be produced very cheaply and accurately and to be caused to work at frequencies at least one order higher than has been possible in the past.

We claim:

1. A method of information multiplex processing, comprising:
    conversion of information signals represented in parallel into information signals propagating serially along a first energy propagation path with predetermined mutual time distances,
    conversion of a plurality of information signals transmitted serially along a second energy propagation path with predetermined mutual distances into information signals in parallel,
    brief transmission of electric energy to predetermined locations along the first energy propagation path at points of time representing a variation between differences in arrival times for a pair of serial information signals on the first energy propagation path provided at respective locations and the propagation time between the same two locations, respectively,
    registering energy states at a plurality of locations along the second energy propagation path at points of time representing the difference between the arrival times of a pair of information signals at a pair of respective locations along the second energy propagation path,
    said first energy propagation path and said second energy propagation path being operatively interconnected,
    the number of locations on the first energy propagation path being larger than the number of locations on the second energy propagation path,
    using some of the locations on the first energy propagation path for transmission of flag information signals serially with the information signals, and receiving and using flag information signals for producing a detection signal transmitted with a certain propagation rate to gate means connected to respective locations of the second energy propagation path.

2. A method according to claim 1, characterized in that the information signals are substantially represented by a single electric oscillation with a narrow frequency spectrum.

3. A transmitter circuit for converting information signals represented in parallel into information signals capable of serial propagation along an energy propagation path with predetermined mutual time distances therebetween, a plurality of coupling points being positioned along the energy propagation path, each of said coupling points being designed to receive, via a respective gate circuit in response to gate signals, an energy amount defining an information signal represented in parallel,
    means for producing and transmitting the gate signals so that said energy amounts are briefly transferred to respective coupling points at points of time representing the time difference between the predetermined mutual time distance between a pair of information signals provided at respective coupling points and the propagation time between the same two coupling points, respectively, wherein:
    additional coupling points are positioned along the energy propagation path for receiving, via respective additional gate circuits in response to additional gate signals, additional energy amounts defining flag signals to enable synchronized reception of the transmitted information signals, thereby eliminating a need for a separate synchronization line, the energy propagation path comprises a microstrip circuit means for support of microwave energy with a narrow frequency spectrum, and one end of the energy propagation path is terminated reflection-free, the other end of the path being coupled to a microwave transmission line.

4. A receiver circuit for conversion of a plurality of information signals transmitted serially along an energy propagation path with predetermined mutual time distances into information signals in parallel, comprising a plurality of signal taps along the energy propagation path, each of said signal taps being connected to a respective detector circuit, and a trigger circuit to produce and transmit a detection signal for the detector circuit so that an energy state at the signal taps is registered at points of time representing the difference between the arrival times of a pair of information signals at a pair of respective signal taps along the energy propagation path, characterized in that the energy propagation path comprises a microstrip circuit for support of microwave energy with a narrow frequency spectrum, and that one end of the energy propagation path is coupled to a microwave transmission line, the other end of the energy propagation path being coupled to said trigger circuit.

5. A circuit according to claim 3, characterized in that each of said coupling point comprises a plurality of evenly distributed directional couplers connected to respective drive circuits.

6. A circuit according to claim 5, wherein each of said directional couplers is characterized by a coupling coefficient, the coupling coefficients for said directional couplers increasing along a direction toward the other end of the energy propagation path.

7. A circuit according to claim 5, characterized in that each drive circuit comprises an electronic switch with two inputs, one of said inputs being connected to a respective data source, the other of said inputs, for all switches, being connected to respective taps along an internal transmission line.

8. A circuit according to claim 7, characterized in that the internal transmission line is a step-shaped microstrip which is stepped opposite each of said taps to the electronic switches.

9. A circuit according to claim 4, characterized in that said taps comprise a plurality of evenly distributed directional couplers which are each connected to one input of an associated gate circuit, another input of said gate circuits being connected to taps along an internal transmission line having an input end connected to an output of said trigger circuit.

10. A circuit according to claim 9, wherein each of said directional couplers is characterized by a coupling coefficient, the coupling coefficients for said directional couplers increasing along a direction toward the trigger circuit.

11. A circuit according to claim 9, characterized in that the internal transmission line is a step-shaped microstrip which is stepped opposite each tap to the respective gate circuits.

12. A circuit according to claim 9, characterized in that an output of the gate circuits is connected to respective resonator and integrating detector circuits.

13. A circuit according to claim 4, characterized in that the energy propagation path comprises a delay path, having one end coupled to said microwave transmission line and to a regulating circuit, and another end connected to a row of said signal taps along the energy propagation path via an adjustable amplifier which is controlled by said regulating circuit.

14. A circuit according to claim 9, characterized in that the energy propagation path comprises a delay path, whose one end is coupled to said microwave transmission line and to a regulating circuit, wherein the regulating circuit is also connected to an output end of said internal transmission line.

15. A data transmission system comprising: means for converting information signals represented in parallel into information signals capable of propagating serially along a first energy propagation path with predetermined mutual time distances therebetween, means for conversion of information signals transmitted serially along a second energy propagation path with predetermined mutual time distances into parallel information signals, a plurality of coupling points along the first energy propagation path, each of said coupling points being designed to receive an energy amount defining an information signal represented in parallel via a respective gate circuit in response to gate signals, means for producing and transmitting the gate signals so that said energy amounts are briefly transferred to respective coupling points at points of time representing the time difference between the predetermined mutual time distance between a pair of information signals provided at respective coupling points and the propagation time of the signals between the same two coupling points, respectively, a plurality of signal taps along the second energy propagation path, each of said signal taps being connected to a respective detector circuit, means for producing and transmitting a detection signal for a detection means operating with said means for conversion so that energy states at the signal taps are registered at points of time representing a difference between arrival times of a pair of information signals at a pair of respective signal taps along the second energy propagation path, characterized in that the number of locations on the first energy propagation path being larger than the number of locations on the second energy propagation path, using some of the locations on the first energy propagation path for transmission of flag information signals serially with the information signals, a circuit being provided in connection with the second energy propagation path to receive the flag information signals and to produce, in response thereto, said detection signal for the detector means.

16. A system according to claim 15, characterized in that part of the first energy propagation path and part of the second energy propagation path comprise geometrically identical microstrip circuits, and that the first energy propagation path moreover comprises microstrip circuits for transmission of flag information signals serially with the data signals, the second energy propagation path comprising an adjustable amplifier and a trigger circuit disposed at opposite ends of said part of the second energy propagation path.

17. A system according to claim 16, characterized in that the microstrip circuits are designed to support electromagnetic signals with a relatively narrow frequency spectrum.

18. A system according to claim 15, characterized by a transmission bus common to a plurality of energy propagation paths, all associated first energy propagation paths being coupled to the bus via uniformly oriented first directional couplers, all associated second energy propagation paths being coupled to the bus via second directional couplers oppositely oriented with respect to the first directional couplers.

19. A circuit according to claim 13, characterized in that the regulating circuit is also connected to an output end of said microwave transmission line.

* * * * *